(12) United States Patent
Wu

(10) Patent No.: US 7,495,491 B2
(45) Date of Patent: Feb. 24, 2009

(54) INVERTER BASED DUTY CYCLE CORRECTION APPARATUSES AND SYSTEMS

(75) Inventor: Zuoguo Wu, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 61 days.

(21) Appl. No.: 11/680,614

(22) Filed: Feb. 28, 2007

(65) Prior Publication Data

US 2008/0204097 A1 Aug. 28, 2008

(51) Int. Cl.
H03K 3/017 (2006.01)
H03K 5/04 (2006.01)
H03K 7/08 (2006.01)

(52) U.S. Cl. .................. 327/175; 327/172; 327/176

(58) Field of Classification Search .............. 327/31, 327/33–38, 172–176
See application file for complete search history.

(56) References Cited

U.S. PATENT DOCUMENTS 5,572,158 A * 11/1996 Lee et al. ................. 327/175
6,411,145 B1 * 6/2002 Kueng et al. ............. 327/175
6,456,133 B1 * 9/2002 Nair et al. ................ 327/175
6,833,743 B2 * 12/2004 Gu et al. .................. 327/175
6,900,681 B2 * 5/2005 Takano .................... 327/175
6,933,759 B1 * 8/2005 Wu et al. .................. 327/172

* cited by examiner

*Primary Examiner*—Lincoln Donovan
*Assistant Examiner*—Patrick O'Neill
(74) *Attorney, Agent, or Firm*—Schubert Osterrieder & Nickelson PLLC; Garland D. Charpiot

(57) ABSTRACT

Apparatuses, circuits, and methods to reduce duty cycle errors are disclosed. Embodiments generally comprise buffer circuits coupled with error detection circuits and correction feedback circuits that sense duty cycles errors in output signals from the buffer circuits, generate error signals, and couple the error signals back to the inputs to correct or reduce the duty cycle errors. The error circuits may comprise active low pass filters in various embodiments, while amplifiers generally comprise inverter buffers or other simple buffers which alter or affect the input signals to the buffer circuits in order to reduce the duty cycle errors. In many system and apparatus embodiments, the error circuits comprise a resistor-capacitor circuit coupled with an inverter buffer. The error detection circuits generally function as active low pass filters and generate error signals for the feedback circuits.

15 Claims, 4 Drawing Sheets

INVERTER BASED DUTY CYCLE CORRECTION APPARATUSES AND SYSTEMS

FIELD

The embodiments herein generally relate to the field of electronic devices. More particularly, the embodiments relate to duty cycle correction apparatuses, systems, and methods.

BACKGROUND

Designers of microprocessors and other high performance electronic devices such as communication systems and high frequency application specific integrated circuits (ASICs) are continually improving the throughput and performance of such devices by increasing internal operating frequencies. These high performance electronic devices and systems usually contain digital circuits which require clock signals to operate.

Forwarded clocks are used in high speed input-output (I/O) systems, such as Fully Buffered Dual In-line Memory Module (FBD) I/O systems. In these high speed I/O systems the data are frequently double pumped, meaning data are transmitted for both the rising and falling edges of a clock signal. Deviations in clock duty cycles will often cause timing errors and directly reduce the permissible data transmission-reception windows. The deviation becomes even more of an issue for high-loss interconnect-channels since the problem is often compounded by jitter. Correcting duty cycle is therefore often essential when transferring data at high speeds. Additionally, duty cycle correction is frequently needed on the receiver side to correct for distortions resulting from the interconnect channels, forwarded clock amplifiers, and clock distribution systems.

Current art Duty Cycle Correctors (DCC) in many of the FBD products today employ numerous types of classic and common circuits. Additionally, the designs usually contain several circuit blocks. For example, these circuits often contain a duty cycle detector circuit, a duty cycle corrector circuit, one or more amplifier circuits, a low swing to full swing level converter circuit, and a full to low swing converter. While these designs generally achieve good overall performance, power dissipation and the necessary silicon area required to implement such designs usually limit the use of these circuits to the I/O port level, in other words only one per port. In many instances, it would be beneficial to place DCC circuits in every transmit data line of a high-speed I/O bus, but as noted above power and area usually precluded such usage. Duty cycle correction circuits which require small silicon areas and consume less quantities of power are needed.

BRIEF DESCRIPTION OF THE DRAWINGS

Aspects of the embodiments will become apparent upon reading the following detailed description and upon reference to the accompanying drawings in which like references may indicate similar elements.

DETAILED DESCRIPTION OF EMBODIMENTS

Figure 1A:
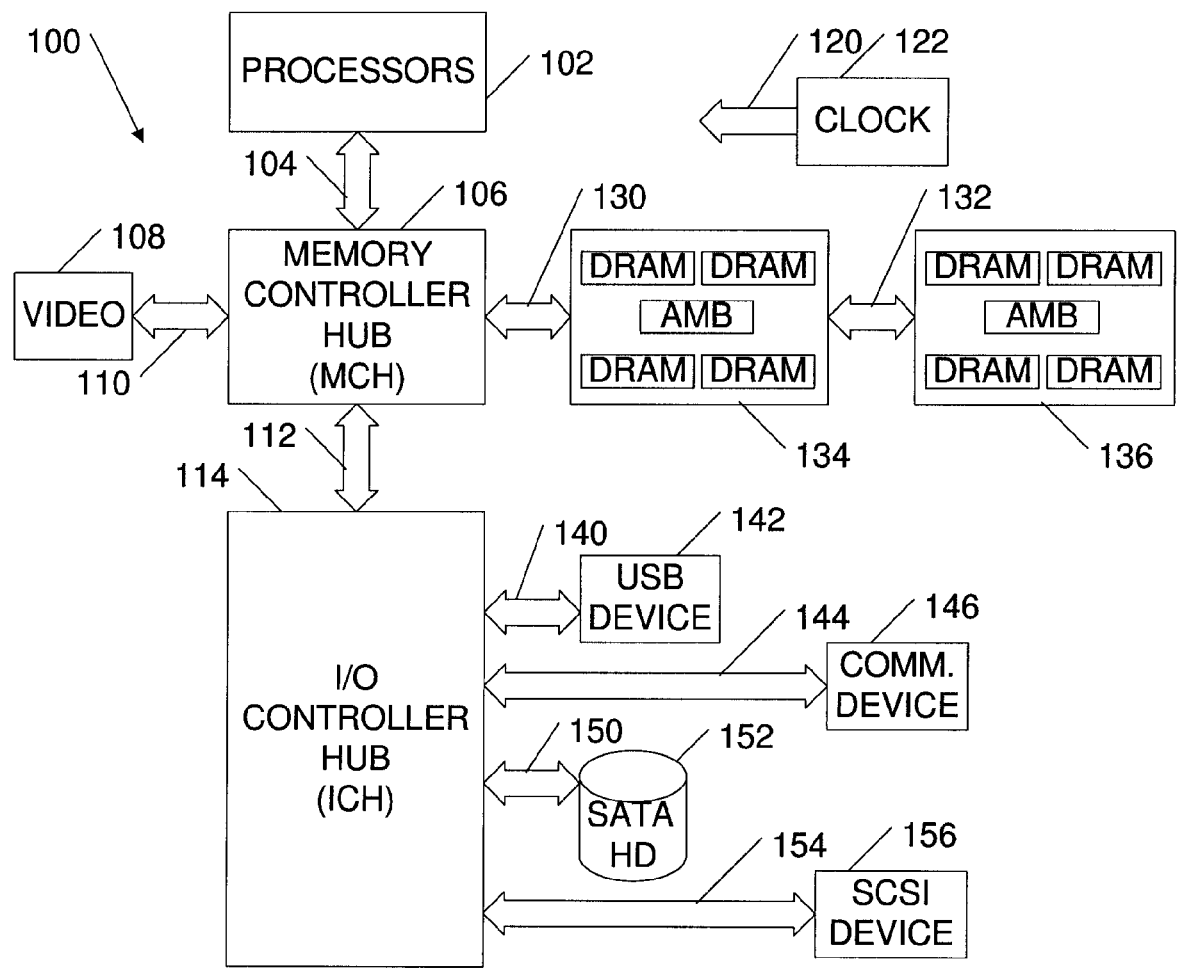
FIG. 1A depicts a system comprising processors, memory, a memory controller hub, and an I/O controller hub employing several duty cycle correction circuits.

The following is a detailed description of embodiments depicted in the accompanying drawings. The specification is in such detail as to clearly communicate the embodiments. However, the amount of detail offered is not intended to limit the anticipated variations of embodiments; but on the contrary, the intention is to cover all modifications, equivalents, and alternatives consistent with the spirit and scope of the embodiments as defined by the appended claims.

Generally speaking, duty cycle correction apparatuses and systems are contemplated. Embodiments generally comprise buffer circuits, usually in the form of integrated circuits chips, coupled with error detection circuits that sense the duty cycle errors of output signals. In these embodiments, the error detection circuits generally create signals related to measurements of duty cycle errors and transfer them to correction feedback circuits which create the error correction signals and add them to inputs of the buffer circuits in order to correct duty cycle errors. In many apparatus and system embodiments, the buffer circuits receive differential signals which have duty cycle errors. The embodiments generally sense duty cycle errors in the output signals using active low pass filters and use the resulting filtered signals to create error correction signals. These embodiments then generally amplify and feed the resulting error correction signals back to the inputs of the buffer circuits.

Some apparatus and system embodiments described herein have buffer circuits comprising one or more inverters. The error circuits coupled to the buffer circuits may comprise resistor-capacitor (RC) circuits with inverters. The RC circuits may work in conjunction with the inverters to function as low pass filters, creating error correction signals upon sensing duty cycle errors in the output signals. Upon creating the error correction signals from the duty cycle errors, the duty cycle correction circuits may amplify the error correction signals and feed the amplified signals back to the inputs of the buffer circuits. By feeding the correction signals back to the inputs of the buffer circuits, the resulting input signals may have reduced duty cycle errors. With reduced duty cycle error input signals, the buffer circuits may then produce output signals having reduced duty cycle errors.

Method embodiments generally comprise receiving an input signal at an input of a buffer circuit, sensing a duty cycle error at an output of the buffer circuit, and filtering a duty cycle error signal from the output with a low pass filter to create an error correction signal. Upon creating the error correction signal, embodiments according to the method may amplify the error correction signal and alter the input signal with the amplified error correction signal to correct the duty cycle error. Some embodiments correct duty cycle errors in forwarded clock signals. Other embodiments may correct duty cycle errors for other types of cyclical signals, where duty cycle error may need to be kept to a minimum for proper circuit or device operation.

While portions of the following detailed discussion describe embodiments to correct duty cycle errors in forwarded clock circuits of computing apparatuses, persons of ordinary skill in the art will recognize that alternative embodiments may correct duty cycle error in other types of signaling circuits, such as high speed communication circuits. Persons of ordinary skill in the art will also recognize that the phrase "duty cycle correction" generally refers to the acts of reducing the magnitudes of duty cycle errors and not necessarily removing all duty cycle errors. Additionally, while some portions of the discussion describe correcting duty cycle errors in forwarded clock circuits by employing inverting buffers, other embodiments may correct duty cycle errors by using other types of circuit elements, such as by using one or more non-inverting buffers.

Turning now to the drawings, FIG. 1A depicts a system 100 employing several duty cycle correction circuits. As shown in FIG. 1A, system 100 may have several processors 102, a memory controller hub (MCH) 106, memory elements 134 and 136, and an I/O controller hub (ICH) 114. In some embodiments system 100 may comprise a computer system, such as a notebook computer, a desktop computer, or personal digital assistant (PDA). In other embodiments system 100 may comprise a different type of apparatus having one or more high speed I/O channels, such as a personal video recorder (PVR), a digital video camera, a cellular telephone, a video game machine, or a portable music player.

In the embodiment shown in FIG. 1A, system 100 may have several computing cores comprising processors 102. For example, processors 102 may have four cores coupled with internal processor cache memory. The cores may couple to the cache via an internal high speed interconnect bus. The internal high speed interconnect bus may send a high frequency forwarded clock signal between the cores and the cache memory. Processors 102 may receive one or more clock signals from clock 122 via clock bus 120. Processors 102 may have their cores send and receive data to and from the cache based on one or more forwarded clock signals derived from clock 122. For example, one forwarded clock signal may be a clock signal having a frequency eight times as great as the frequency of clock 122. In various embodiments, circuits within processors 102 may receive the forwarded clock signals from internal high speed interconnect buses and help correct duty cycle errors in those forwarded clock signals.

Processors 102 may execute operating instructions for programs and applications run by users of system 100, such as instructions of a web browser or a computer aided design (CAD) application. Such software programs and related instructions may be stored in memory elements 134 and 136. Processors 102 may execute the instructions in memory elements 134 and 136 by interacting with MCH 106. The types of memory devices comprising memory elements 134 and 136 may vary in different embodiments. In some embodiments memory elements 134 and 136 may comprise volatile memory elements, such as eight 1-gigabyte (GB) dynamic random access memory (DRAM) sticks. In other embodiments of system 100, the memory may comprise different quantities and different types of memory, such as different amounts nonvolatile memory. For example in some embodiments memory elements 134 and 136 may comprise a single flash memory module, such as a 4 GB flash memory card.

Processors 102 may be coupled to MCH 106 via a high speed interface bus 104. Similarly, MCH 106 may be coupled with memory elements 134 via high speed interface buses 130 and 132. For example, buses 130 and 132 may comprise FBD buses that transfer data to and from the advanced memory buffer (AMB) and DRAM elements for memory elements 134 and 136 using two bidirectional link interfaces employing high-speed differential point-to-point electrical signaling. Buses 130 and 132 may transfer the data using, for example, 2 gigahertz (GHz) transfer bursts. Double pumping data on the rising and falling edges of such high frequency clock cycles may require that the forwarded clock signals have small duty cycle errors. Duty cycle error circuits may reduce the duty cycle errors by employing different DCC circuit embodiments, described herein.

Processors 102 may also interact with ICH 114 via a high speed interface bus 112, in addition to high speed interface bus 104 for MCH 106. One or more of high speed interface buses 104 and 112 may send and/or receive forwarded clock signals between processors 102, MCH 106, and ICH 114. In such embodiments, DCC circuits within processors 102, MCH 106, and ICH 114 may reduce duty cycle errors in the forwarded clock signals.

ICH 114 may allow processors 102 to interact with external peripheral devices, such as keyboards, scanners, and data storage devices. Programs and applications being executed by processors 102 may interact with the external peripheral devices. In various embodiments, DCC circuits described herein may be employed to increase the speed or performance of ICH 114 while interacting with the external peripheral devices.

Processors 102 may present information to a user via a display device coupled to video card 108. For example, the type of display device may be a liquid crystal display (LCD) screen or a thin-film transistor flat panel monitor. Video card 108 may be coupled to MCH 106 by a high speed I/O bus 110. For example, bus 110 may comprise a high speed Peripheral Component Interconnect Express (PCI-e) bus. To increase the rate at which information is conveyed to the user via video card 108, embodiments may help correct duty cycle errors in DCC circuits for the forwarded clock circuits coupled with high speed I/O bus 110.

In various embodiments, ICH 114 may allow processors 102 to store and retrieve data from a universal serial bus (USB) device 142. For example, processors 102 may store and retrieve data from USB device 142 while running an application. Processors 102 may also send and receive data via communication device 146. For example, communication device 146 may comprise a network card. In such embodiments, one may improve the performance of system 100 by employing the techniques described herein for circuits coupled to high speed interface buses 140 and 144. In other words, a designer of system 100 may increase the clock frequency of the forwarded clock signals for one or more of the high speed interface buses 140 and 144 to increase the throughput of ICH 114, communication device 146, and USB device 142.

In addition to USB device 142 and communication device 146, ICH 114 may also interact with Advanced Technology Attachment (ATA) devices, such as ATA hard drives, compact disc (CD) drives, and digital versatile disc (DVD) drives. As shown in FIG. 1A, system 100 may have a high speed Serial ATA (SATA) bus 150 coupling a SATA drive, such as SATA hard drive 152, to ICH 114. SATA hard drive 152 may be used to store an operating system, device drivers, and application software for system 100. For example, in some embodiments SATA hard drive 152 may store a Linux®, a Unix®, a Macintosh® OS X, a Windows® or some other operating system. To improve the rate of date transfer between SATA hard drive 152 and ICH 114, various embodiments may reduce duty cycle errors in forwarded clock circuits within ICH 114 or SATA hard drive 152.

Additionally, ICH 114 may store and retrieve data using a Small Computer Systems Interface (SCSI) device 156 via a high speed interface bus 154. In such embodiments, one may improve the performance of system 100 by employing DCC in circuits coupled to high speed interface bus 154.

As noted above, system 100 may employ clock 122 to generate a global clock signal for various elements of system 100. In various embodiments, circuits within each of the system 100 elements coupled to the respective high speed interface buses may reduce duty cycle errors and improve system performance. For example, in addition to or in lieu of high speed interface bus 110, video card 108 may receive a global high frequency forwarded clock signal from clock 122 via clock bus 120 and employ a DCC circuit to help reduce duty cycle errors.

System 100 may also employ DCC circuits with high speed interface buses to couple with other types of hardware not depicted in FIG. 1A, such as a sound card, a scanner, and a printer, as examples. Conversely, in different embodiments, system 100 may not comprise all of the elements used to illustrate the embodiment shown in FIG. 1A. For example, some embodiments of system 100 may not comprise SCSI device 156, USB 142, communication device 146, or their respective interface buses.

Figure 1B:
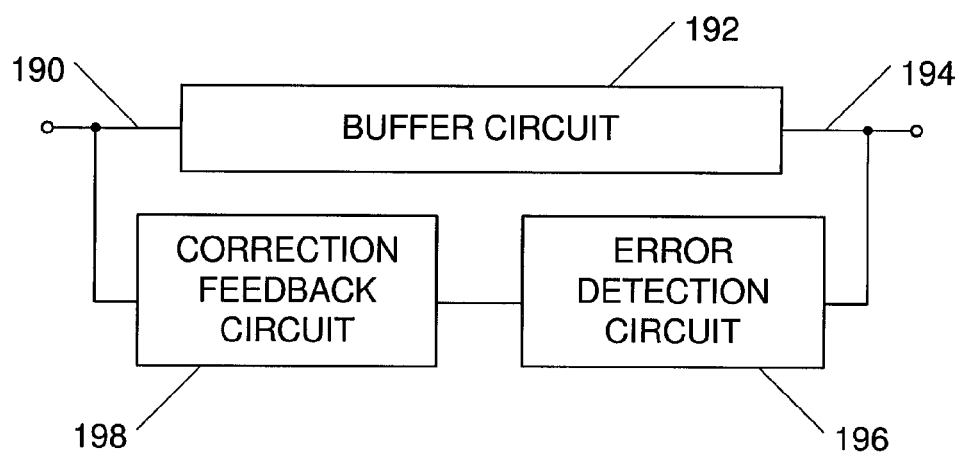
FIG. 1B shows an apparatus for correcting duty cycle errors comprising a buffer circuit, an error correction circuit, and a correction feedback circuit.

FIG. 1B shows an apparatus for reducing duty cycle errors comprising a buffer circuit 192, an error detection circuit 196, and a correction feedback circuit 198. The apparatus of FIG. 1B may be used to reduce duty cycle errors in high speed I/O links, such as FBD buses 130 and 132, as well as other high speed buses, such as bus 110, shown in FIG. 1A.

The apparatus of FIG. 1B has an input 190 to receive a cyclical input signal. In some embodiments, input 190 may comprise a single-ended input. In alternative embodiments, input 190 may comprise a differential input. In other words, input 190 may comprise two terminals wherein one phase of an input signal may involve sending a first input terminal high while sending a second input terminal low. A second phase of the input signal may therefore involve sending the first input low while sending the second input high. Upon receiving the cyclical input signal at input 190, buffer circuit 192 may buffer this signal and produce a cyclical output signal at output 194.

The output signal may have a duty cycle error. For example, the input signal to input 190 may comprise a clock signal. The clock signal may be generated by a crystal oscillator and associated circuitry that may not provide a clock signal having a duty cycle of 50%. In other words the clock signal may have a duty cycle of 45%, meaning the percentage of time the clock signal is logically high is 45% while the signal is logically low the remaining 55% of the clock cycle. The circuit receiving the output signal from output 194 may be unable to tolerate such a large duty cycle error. For example, one type of circuit that requires a clock signal to operate is a memory circuit, such as dynamic random access memory (DRAM) circuit, a synchronous dynamic random access memory (SDRAM) circuit, or a double data rate synchronous dynamic random access memory (DDR-SDRAM) circuit.

For such memory circuits operating at high frequencies, a clock signal having a duty cycle as close to 50% as possible is desired so that the memory has approximately an equal amount of time on both the logic high and logic low portions of the clock signal for transferring data. A duty cycle of 50% allows the maximum amount of time for latching both rising edge data and falling edge data in a memory circuit. If the output signal generated at output 194 has a duty cycle error, the error may be sensed by error detection circuit 196. For example, error detection circuit 196 may detect that the duty cycle of the output signal is high 45% of the time and low 55% of the time.

Upon detecting the duty cycle error, error detection circuit 196 may produce an associated error correction signal that is related to the amount of duty cycle error. Continuing with the example, error detection circuit 196 may produce a signal corresponding to a 5% error in duty cycle. Correction feedback circuit 198 may receive the signal, amplify it, and mix the resulting amplified signal back with the input signal at input 190. Mixing the error correction signal back with the input signal may result in correcting the duty cycle error in the output signal at output 194. Again continuing with our example, receiving a signal corresponding to 5% duty cycle error, correction feedback circuit 198 will try to alter the signal at input 190 which will in turn change the signal at output 194. With change at 194, error detection circuit 196 will detect the changed duty cycle error amount, and the correction process may continue. The system may continue this correction process until the output duty cycle nears and approximates 50%. Upon such a mixing or combining of the input signal and error correction signal, the duty cycle error in the resulting output signal may be decreased from 5% to 0% error.

Worth emphasizing out is the fact that the apparatus of FIG. 1B may have additional circuit modules. For example, when buffer circuit 192 is designed for a differential signal, having two inputs and two outputs, the apparatus may have additional error circuits and correction feedback circuits. In other words, error detection circuit 196 and correction feedback circuit 198 may help correct duty cycle errors for one output and input set while a second error circuit and second correction feedback circuit may help correct duty cycle errors for the other output and input set.

Figure 2:
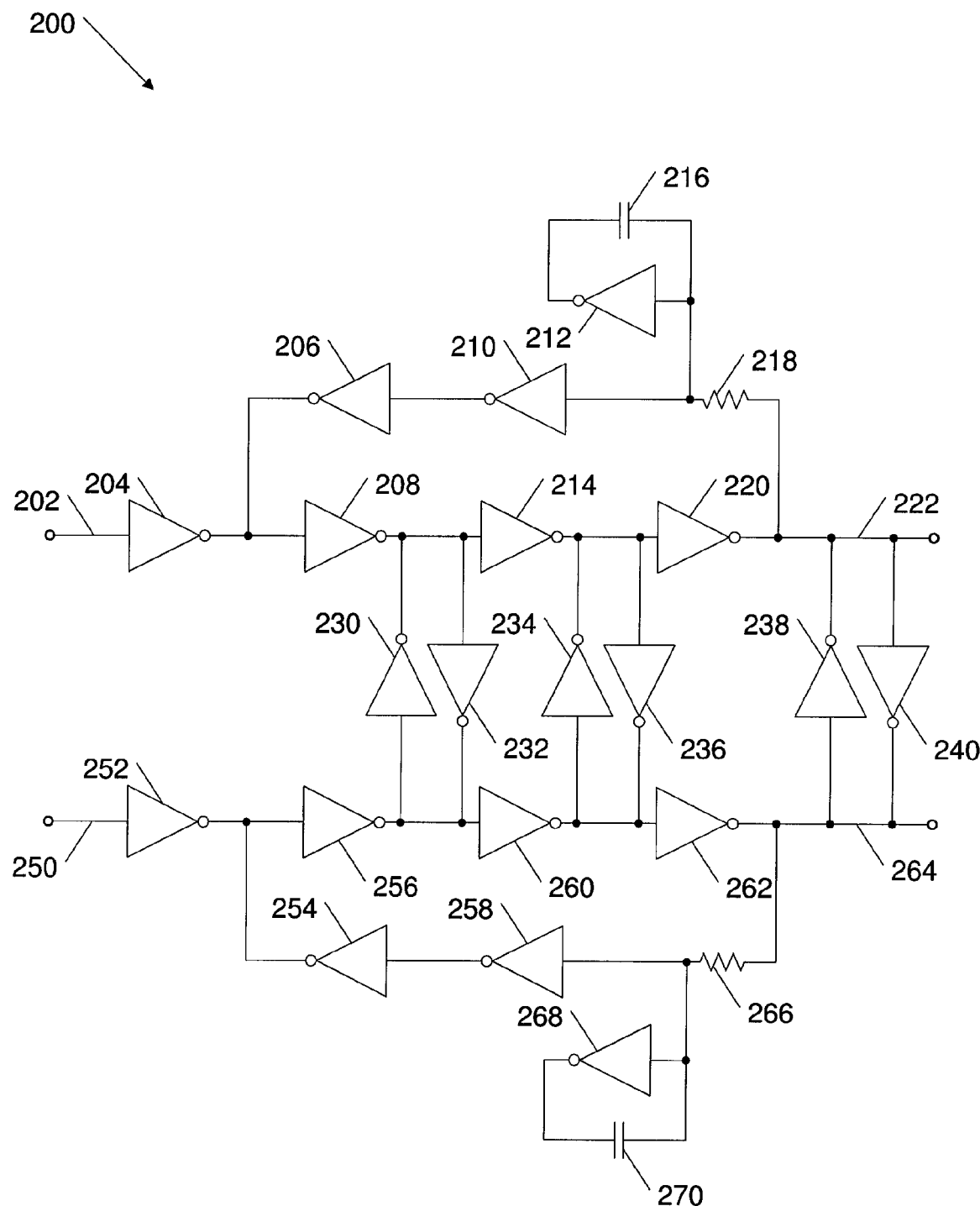
FIG. 2 shows an embodiment of a duty cycle correction circuit for a differential input signal.

Moving now to FIG. 2, we see an embodiment of a duty cycle correction (DCC) circuit 200 that may be employed to correct a duty cycle error of a differential output signal. The embodiment of DCC circuit 200 depicted in FIG. 2, may be created by using only complimentary metal oxide semiconductor (CMOS) inverters, resistors, and capacitors. Since no complicated circuits such as differential amplifiers, integrators, and level converters are used, the number of devices needed for DCC circuit 200 may therefore be relatively small. The relatively small number of devices may lead to low power and small area if implemented in an integrated circuit.

A cyclical input signal, such as a forwarded clock signal, may be transferred to input 250 and second input 202. For example, an input signal applied to inputs 250 and 202 may comprise a differential input signal, wherein one input is high when the other input is low, and vice-versa. Once applied to inputs 250 and 202, the differential input signal may propagate through the respective forward paths of the differential buffer circuit section of DCC circuit 200. Inverter or inverting buffers 204, 208, 214, 220, 252, 256, 260, and 262 may comprise the differential buffer circuit, such as buffer circuit 192 shown in FIG. 1B.

The portion of the input signal applied to input 250 will pass through inverting buffers 252, 256, 260, 260, and 262, while the portion of the input signal applied to second input 202 will pass through inverting buffers 204, 208, 214, and 220. The inverters in the forward paths may serve as clock buffers. If the differential input signal applied to inputs 250 and 202 has no duty cycle error, then the resulting output signal produced at output 264 and second output 222 may have no resulting duty cycle error after propagating through the forward paths. For the time being, one may not need to be concerned with duty cycle error resulting from circuit component mismatches. However, when the differential input signal has a duty cycle error, the forward paths may propagate the duty cycle error through to outputs 222 and 264. To see how the duty cycle error for each of the paths may be reduced, we can look at the operation of one path since the forward paths are constructed similarly.

Suppose a differential input signal applied to inputs 250 and 202 has a duty cycle error of 20%. In other words, suppose that the portion of the input signal applied to input 250 is low 30% of the time and high 70% of the time, while the portion of the input signal applied to input 202 is high 30% and low 70% of the time. As the portion of the input signal applied to input 250 propagates through the associated forward path of inverting buffers 252, 256, 260, and 262, the polarity of the signal at output will match that of the input signal. That is to say, the unmodified output signal present at output 264 will match the polarity of the input signal, taking into account the propagation delays of the inverting buffers in the forward path.

In our stated example, the input signal applied to input 250 will be high more than it is low (70% vs. 30%). Consequently, the output signal will tend to be high more than it is low. Resistor 266, capacitor 270, and inverting buffer (inverter) 268 having its input and output connected to both terminals of capacitor 270, form an active low pass filter. Resistor 266, which comprises a series resistance of the low pass filter, may be 30,000 ohms (30 KΩ) and capacitor 270 may be 500 fempto Farads (500 fF) in the embodiment of FIG. 2. The low pass filter comprising resistor 266, capacitor 270, and inverter 268 may tend to detect an average voltage value of the output signal at output 264.

When there is a duty cycle error, as is the case in our current example, the amount of time that output 264 is high (+) relative to the time that output 264 is low (−) will be different, which may be passed through the filter as direct current (DC) average value differences. Inverters 258 and 254 in the feedback path following the low pass filter may act like analog amplifiers and amplify the DC average value differences originated from the duty cycle error. The reason that inverters 258 and 254 may act like analog amplifiers is that the proper DC operating point may be set at the output of the active filter consisting of resistor 266, capacitor 270 and inverter 268. The resulting voltage produced at the output of inverter 254 may be coupled with the forward clock path, at the output of inverting buffer 252, to reduce the duty cycle error.

Similar to the portion of the differential signal applied to input 250, the portion of the input signal applied to input 202 may propagate through the associated forward path of inverting buffers 204, 208, 214, and 220, with the polarity of the signal at output similarly matching that of the input signal after the propagation delays. However, in this case the output signal will tend to be low more than it is high. Resistor 218, capacitor 216, and inverter 212 form a second active low pass filter. Resistor 218 may also be 30 KΩ while capacitor 216 may also be 500 fF in the embodiment of FIG. 2. The second low pass filter comprising resistor 218, capacitor 216, and inverter 212 may also detect an average voltage value of the output signal at output 222.

At second output 222, the amount of time that output 222 is low (−) relative to the time that output 222 is high (+) may also be different, which may pass through the second filter as DC average value differences. Inverters 210 and 206 in the feedback path again may act like analog 8amplifiers and amplify the DC average value differences originated from the duty cycle error. The resulting voltage produced at the output of inverter 206 may be coupled with the second forward clock path, at the output of inverting buffer 204, for reduction of the duty cycle error. When the circuit operates in this closed loop fashion, DCC circuit 200 may arrive at a balanced condition, such that the duty cycle error associated with an input signal transferred to inputs 250 and 202 may be reduced by the feedback paths of the two low pass filters and the inverters (258, 254, 210, and 206). As a consequence, the differential output signal present at outputs 264 and 222, respectively, may have reduced duty cycle errors.

Worth pointing out, offsets introduced by the elements of the inverter chains may also be corrected since such offsets are introduced inside the feedback loops. Consequently, inverters may be used even though inverters tend to be single-ended by design. The three sets of complimentary inverters connecting each of the forward paths for DCC circuit 200 (inverters 230 and 232, inverters 234 and 236, and inverters 238 and 240) help ensure that both of the forward paths stay synchronized, such that the outputs of each of the inverters switch at relatively the same times and that one forward path processes a high differential input signal when the second forward path processes a low differential input signal, and vice-versa.

In the embodiment of FIG. 2, DCC circuit 200 has inputs 250 and 202 with corresponding outputs 264 and 222, respectively. As described earlier, output signals at outputs 264 and 222 may match the polarity of the respective input signals after the path propagation delays. In alternative embodiments, the respective output signals may actually be inverted from their respective input. In other words, output 222 may rise high after input 202 is drawn low, again taking into account the propagation delays. Additionally, in alternative embodiments, the number of inputs may be different. For example, instead of two inputs DCC circuit 200 may only have a single input terminal and a single output terminal. In such an embodiment, DCC circuit 200 may also only have one low pass filter and one feedback amplifier in a single feedback path.

In even further alternative embodiments, the types and numbers of other components in DCC circuit 200 may also vary. For example, a buffer circuit in an alternative embodiment may not have inverters 230 and 232, with inverting buffers 214 and 260 being replaced with non-inverting buffers. In another alternative embodiment, inverters 254 and 258 may be replaced with a single non-inverting buffer. In an even further alternative embodiment, DCC circuit 200 may not have inverting buffers 204 and 252, wherein inputs 250 and 202 may be coupled to inverters 256 and 208, respectively. For these embodiments, the outputs of inverters 254 and 206 may couple directly to inputs 250 and 202, respectively, or the outputs of inverters 254 and 206 may couple to the outputs of inverting buffers 256 and 208, respectively.

Also, as described above, resistors 266 and 218 may be 30 KΩ while capacitors 270 and 216 may be 500 fF. Such values may be sufficient to help correct duty cycle errors for a differential input signal having a frequency, for example, between 1.6 GHz and 6.4 GHz. Alternative embodiments may have different values of resistance and capacitance, to accommodate different input frequencies for example. Additionally, while the embodiment of FIG. 2 may help correct duty cycle for errors ranging from 1% to 20%, alternative embodiments may have larger or smaller dynamic ranges. For example, it may be possible to increase the gain to further reduce the feedback error provided other conditions, such as stability, are met. Similarly, while the embodiment of FIG. 2 may consume 1.5 milliWatts (mW) of power at 3.2 GHz, other circuits and arrangements may consume more or less power at the same frequency based on their component configurations. These are just a few of the possible alternative embodiments. Other alternative embodiments may remove, add, or substitute other circuit components and still produce similar duty cycle correction consistent with the concepts described for the embodiment depicted in FIG. 2.

Figure 3:
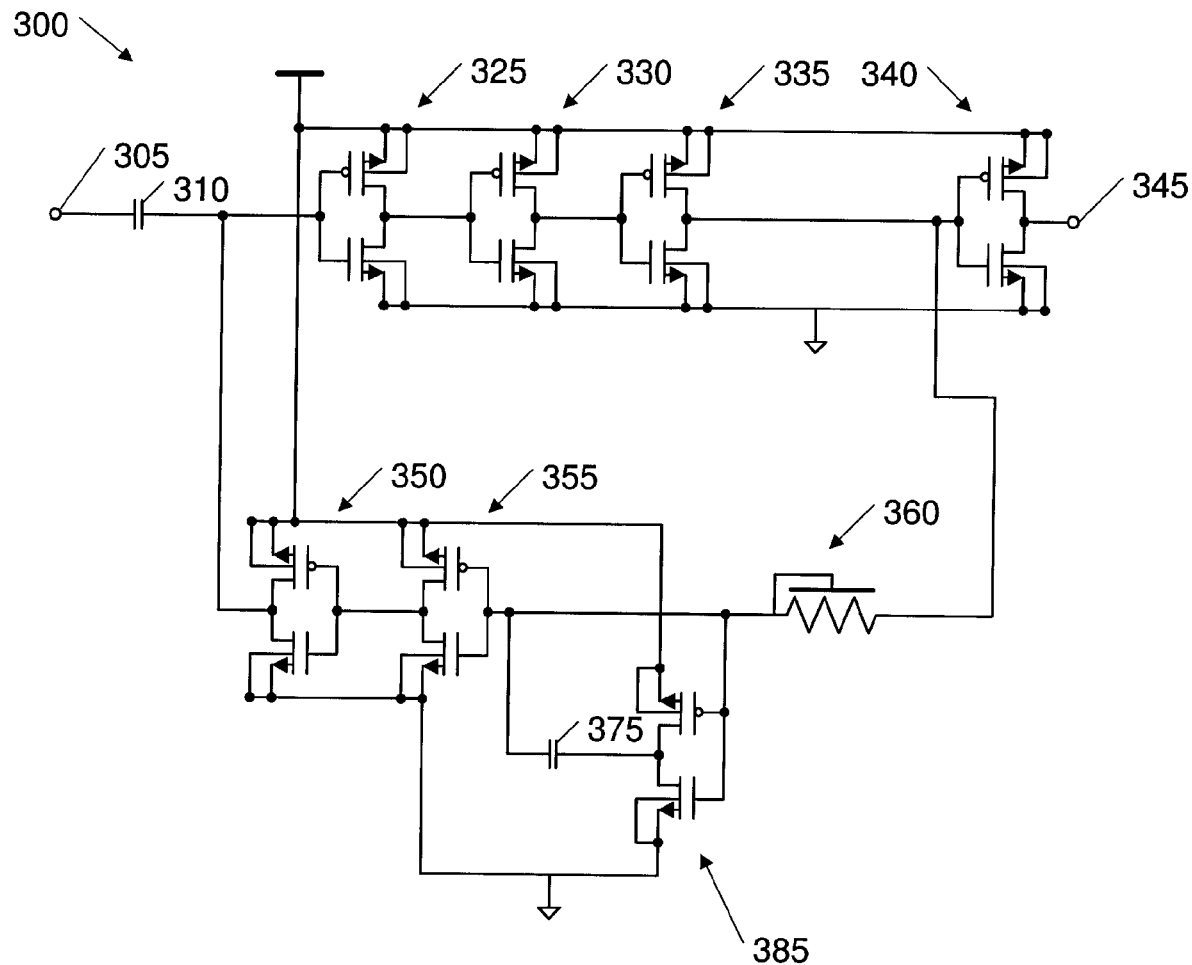
FIG. 3 shows an embodiment of a single-ended duty cycle correction circuit.
Figure 3:
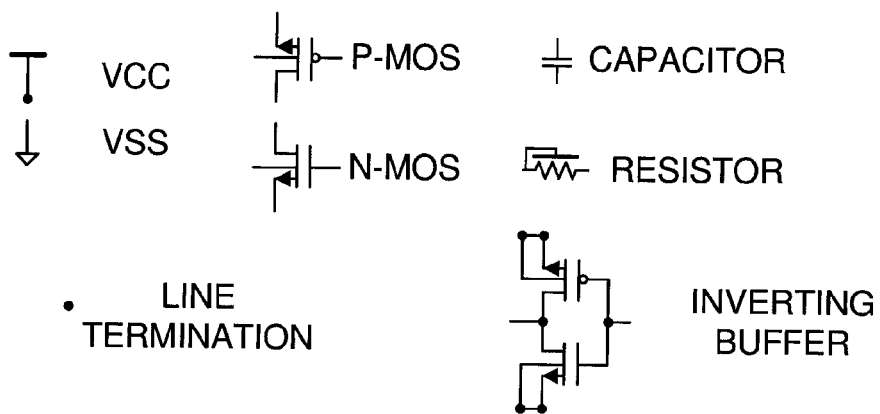

To illustrate a circuit to help correct duty cycle errors for a non-differential cyclical signal, we move now to FIG. 3. FIG. 3 depicts one embodiment of a single-ended duty cycle correction circuit (DCC) 300. DCC circuit 300 has a single input 305 and a single output 345. Coupling capacitor 310 may provide alternating current (AC) coupling for a cyclical input signal, such as a clock signal, transferred to input 305. Additionally, as shown in FIG. 3, a feedback loop correction signal may be coupled to the terminal of coupling capacitor 310 opposite input 305.

The clock signal may propagate through the p-MOS and n-MOS transistor pairs, which form a series of inverting buffers in the forward clock path. That is to say, the clock signal applied to input 305 may be inverted by inverting buffer 325, inverted again by inverting buffer 330, inverted again by inverting buffer 335, and inverted once again by inverting buffer 340 before being transmitted from DCC circuit 300 via output 345.

When the clock signal applied to input 305 has a duty cycle error, resistor 360, capacitor 375, and inverter 385 may form an error circuit which may function as a low pass filter. If duty cycle error is present, the low pass filter may detect an error signal by shifting the DC level from the ideal case of a perfect duty cycle. The error signal produced by the low pass filter may propagate through inverters 355 and 350, which may amplify the correction feedback signal to couple it with the input signal transferred to input 305, such that the combined or mixed signal is applied to the input of inverter 325 in the forward path. Closed loop circuit operation in this manner may tend to help correct the duty cycle of the output signal from output 345.

DCC circuit 300 is a single-ended input circuit, as opposed to a differential input version like DCC circuit 200 shown in FIG. 2. Consequently, DCC circuit 300 may generally consume less power and require an even smaller amount of area to implement than DCC circuit 200 or its alternatives. Additionally, while the embodiment of DCC circuit 300 is implemented using AC coupling, DCC circuit 200 may also be implemented with such coupling. Both DCC circuit 200 and DCC circuit 300 may need to be evaluated for stability, due to the feedback nature and depending on the overall demands required by the associated systems connected to them. Stabile operation may be accomplished with proper selection of the resistance and capacitance values. Both DCC circuit 200 and DCC circuit 300 may be small enough and consume small enough quantities of power so that they may be feasibly implemented in multiple locations of a design (more than 1 per port) in high speed bus applications, such as with FBD or other types of multi-lane I/O buses.

Figure 4:
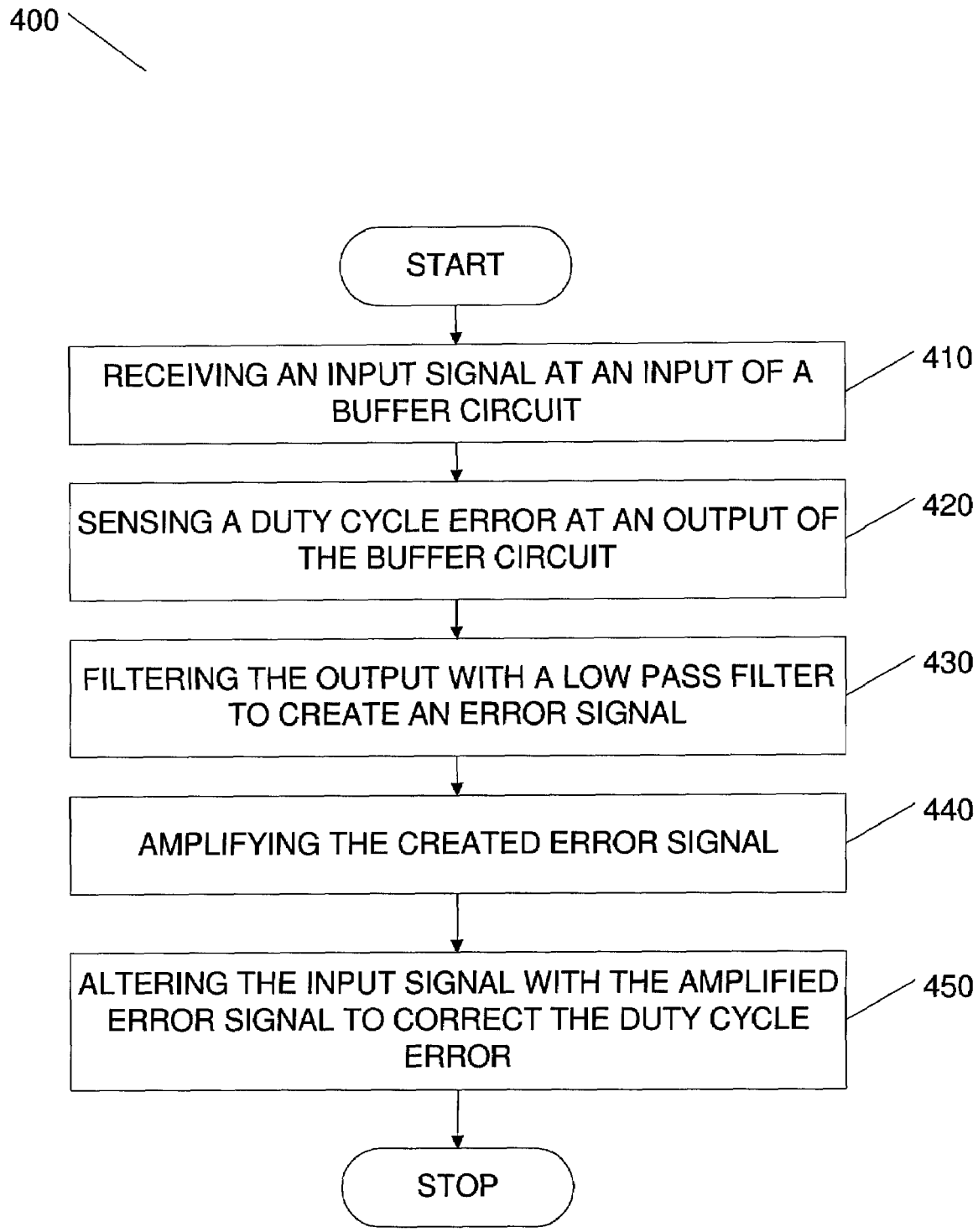
FIG. 4 illustrates a method for correcting duty cycle errors.

FIG. 4 depicts a flowchart 400 illustrating an embodiment of a method for reducing duty cycle errors. Flowchart 400 begins with receiving an input signal at an input of a buffer circuit (element 410). For example, the input signal may comprise a forwarded clock signal. An embodiment according to flowchart 400 may continue by sensing a duty cycle error at an output of the buffer circuit (element 420) and the output with a low pass filter to create an error signal (element 430). For example, the low pass filter may generate a DC voltage level shift corresponding to a 5% duty cycle error, wherein the forwarded clock signal is low more than it is high. An embodiment according to flowchart 400 may continue by amplifying the error signal (element 440) and altering the input signal with the amplified error signal to help correct the duty cycle error (element 450). For example, a feedback circuit may amplify the DC voltage level shift corresponding to the 5% duty cycle error and couple the amplified correction signal with the input signal, such that the resulting input signal is altered to remain high 5% more of the time and therefore correct, or help reduce, the 5% duty cycle error being produced at the output of the buffer circuit.

It will be apparent to those skilled in the art having the benefit of this disclosure that the embodiments herein contemplate apparatuses, circuits, systems, and methods to help correct duty cycle errors using circuits that consumer smaller amounts of power with relatively smaller circuit areas. It is understood that the form of the embodiments shown and described in the detailed description and the drawings are to be taken merely as examples. It is intended that the following claims be interpreted broadly to embrace all the variations of the embodiments disclosed.

Although some aspects have been described in detail for some embodiments, it should be understood that various changes, substitutions and alterations can be made herein without departing from the spirit and scope of the embodiments as defined by the appended claims. Although one embodiment may achieve multiple objectives, not every embodiment falling within the scope of the attached claims will achieve every objective. Moreover, the scope of the present application is not intended to be limited to the particular embodiments of the process, machine, manufacture, composition of matter, means, methods and steps described in the specification. As one of ordinary skill in the art will readily appreciate from the disclosure of the embodiments, processes, machines, manufacture, compositions of matter, means, methods, or steps, presently existing or later to be developed that perform substantially the same function or achieve substantially the same result as the corresponding embodiments described herein may be utilized according to the embodiments herein. Accordingly, the appended claims are intended to include within their scope such processes, machines, manufacture, compositions of matter, means, methods, or steps.

What is claimed is:

1. An apparatus, comprising:
a buffer circuit, wherein the buffer circuit couples an input to an output;
an error detection circuit to detect a duty cycle error of an output signal of the output and produce an error signal based upon a DC voltage level shift corresponding to the duty cycle error, wherein the error direction circuit comprises a resistor coupled to both a buffer input of a buffer and a capacitor, wherein further the capacitor couples the buffer output to the buffer input and the resistor; and
a correction feedback circuit coupled to the error detection circuit and to the input, the correction feedback circuit to receive the error signal and alter a signal transferred from the input to reduce the duty cycle error of the output signal.

2. The apparatus of claim 1, wherein the buffer circuit comprises a differential buffer circuit with a second input and a second output to produce a differential output signal based upon receiving a differential input signal.

3. The apparatus of claim 2, further comprising a second error detection circuit to produce a second error signal based upon a second duty cycle error detected at the second output.

4. The apparatus of claim 3, wherein the second error detection circuit comprises a second resistor coupled to a second capacitor and a second buffer.

5. The apparatus of claim 1, wherein the buffer circuit comprises inverter buffers connected in series.

6. The apparatus of claim 1, wherein the buffer of the error detection circuit comprises an inverter buffer, wherein further the inverter buffer comprises a p-type mental oxide semiconductor (P-MOS) transistor coupled in series with an N-MOS transistor.

7. The apparatus of claim 1, wherein the correction feedback circuit comprises at least one inverter buffer.

8. The apparatus of claim 1, wherein the correction feedback circuit is coupled to the input via an input buffer.

9. The apparatus of claim 1, wherein the buffer output of the error detection circuit is coupled only to the capacitor, directly, wherein further the input of the buffer of the error detection circuit is coupled only to the capacitor and the resistor and the correction feedback circuit.

10. A duty cycle correction circuit, comprising:
an input to receive an input signal;
an output to produce an output signal, wherein the output is coupled to the input via at least one buffer;
a low pass filter coupled to the output wherein the low pass filter comprises a resistor coupled in series with a capacitor and an inverter buffer, wherein further the capacitor couples the inverter buffer output to the inventor buffer input; and
a feedback circuit coupled to the input and the low pass filter, the feedback circuit to receive an error signal from the low pass filter and create a correction signal that is to combine with the input signal and reduce a duty cycle error of the output signal.

11. The duty cycle correction circuit of claim 10, further comprising a second input and a second output coupled to the at least one buffer, wherein the at least one buffer comprises a differential buffer circuit.

12. The duty cycle correction circuit of claim 11, further comprising a second low pass filter coupled to the second output.

13. The duty cycle correction circuit of claim 10, further comprising a coupling capacitor coupled to the input to provide AC coupling with a signal generation circuit coupled to the input.

14. The duty cycle correction circuit of claim 10, wherein the feedback circuit comprises at least one buffer to receive the error signal and create the correction signal.

15. The duty cycle correction circuit of claim 10, wherein the inverter buffer output of the low pass filter is coupled only to the capacitor, wherein further the capacitor is coupled only to the inverter buffer input of the low pass filter, the resistor, and the feedback circuit.

\* \* \* \* \*